(12) United States Patent
Tsukahara et al.

(10) Patent No.: US 7,233,069 B2
(45) Date of Patent: Jun. 19, 2007

(54) INTERCONNECTION SUBSTRATE AND FABRICATION METHOD THEREOF

(75) Inventors: Norihito Tsukahara, Kyoto (JP); Kazuhiro Nishikawa, Osaka (JP); Daisuke Sakurai, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 242 days.

(21) Appl. No.: 10/947,177

(22) Filed: Sep. 23, 2004

(65) Prior Publication Data

US 2005/0079707 A1    Apr. 14, 2005

(30) Foreign Application Priority Data

Sep. 26, 2003   (JP) ............... 2003-335268

(51) Int. Cl.
  *H01L 23/48*   (2006.01)
  *H01L 21/44*   (2006.01)

(52) U.S. Cl. ............... 257/748; 257/750; 438/652; 438/642

(58) Field of Classification Search ............... 438/622, 438/652, 658, 642, 650, 686; 257/746, 748, 257/750, 761–766, 768
See application file for complete search history.

(56) References Cited

U.S. PATENT DOCUMENTS 6,214,636 B1 *   4/2001   Sawayama et al. ............ 438/57
6,891,465 B2 *   5/2005   Hatayama ................... 338/118

FOREIGN PATENT DOCUMENTS

JP       61-224491       10/1986

* cited by examiner

*Primary Examiner*—Kevin M. Picardat
(74) *Attorney, Agent, or Firm*—Wenderoth, Lind & Ponack, L.L.P.

(57) ABSTRACT

An interconnection substrate includes: an interconnection layer region where at least a first conductor layer and a second conductor layer are vertically stacked in that order on a substrate, with the first conductor layer and second conductor layer containing conductive particles and a binder, wherein the first conductor layer and second conductor layer stacked in the interconnection layer region have conductive particles different in average particle size from each other. As a result, only an intended region can have low resistance.

20 Claims, 5 Drawing Sheets

INTERCONNECTION SUBSTRATE AND FABRICATION METHOD THEREOF

BACKGROUND OF THE INVENTION

The present invention relates to an interconnection substrate where an interconnection composed of a conductor layer containing conductive particles and a binder is formed on a substrate, and to a method for fabricating such an interconnection substrate. The present invention relates more specifically to an interconnection substrate having at least two conductor layers stacked.

FIELD OF THE INVENTION

In recent years, electronic devices such as portable phones and personal computers have been rapidly becoming smaller, lower-profile and higher performing. In line with this trend, there is a growing demand for smaller, denser and less expensive interconnection substrates to be used for these electronic devices. In order to achieve dense and inexpensive interconnection substrates, a technique for forming a conductor interconnection by a printing process is drawing attention; however, a problem is that it is impossible to reduce interconnection resistance when conductive resin paste is used. These days it is becoming an important challenge to reduce an environmental load by using environmentally-friendly materials and processes in fabrication of interconnection substrates.

In a printing process which is simple and causes a small environmental load, a reduction in interconnection resistance is a comparatively large challenge. To meet the challenge, there is an approach disclosed in Japanese Laid-Open Patent Application No. S61-224491. In this approach, an interconnection pattern is formed on an insulating substrate by lithography using conductive ink, and then the interconnection pattern is electroplated to form a metal film thereon. Thus, an interconnection with small resistance as a whole can be achieved by forming a metal film with low resistance onto a surface of the conductive ink, which cannot reduce the interconnection resistance sufficiently on its own.

However, this method for fabricating an interconnection substrate is made complicated by use of electroplating, and also requires a process of disposing electroplating wastewater and cleaning solution. This results in an increase in both fabrication cost and environmental load.

In view of these problems, the present invention has an object of providing an interconnection substrate with reduced interconnection resistance, and also a method for fabricating such an interconnection substrate with a simple fabrication process and without an increase in environmental load.

SUMMARY OF THE INVENTION

The interconnection substrate of the present invention includes:

an interconnection layer region where at least a first conductor layer and a second conductor layer are vertically stacked in that order on a substrate, the first conductor layer and the second conductor layer containing conductive particles and a binder, wherein the first conductor layer and the second conductor layer stacked in the interconnection layer region have conductive particles different in average particle size from each other.

A method for fabricating the interconnection substrate of the present invention includes:

forming a first conductive paste layer onto a substrate by using first conductive paste which contains conductive particles and a binder;

hardening the binder to make the first conductive paste layer a first conductor layer;

forming a second conductive paste layer on a prescribed region of the first conductor layer by using second conductive paste which contains conductive particles having a smaller average particle size than the conductive particles contained in the first conductive paste; and forming a second conductor layer by heating the second conductive paste layer to make the conductive particles contained in the second conductive paste layer come into contact with each other and fuse.

According to the aforementioned structure with stacked conductor layers containing conductive particles different in average particle size from each other, and to the aforementioned method for fabricating such a structure, an interconnection layer can be formed at low cost as a whole and by a simple process. In addition, formation of the second conductor layer exclusively on a region required to have low resistance results in a high-performing interconnection substrate even by using a substrate with flexibility. The structure and method has another advantage of not causing an environmental load such as electroplating wastewater.

DETAILED DESCRIPTION OF THE PREFERRED EMBODIMENTS

Following is a detailed description of embodiments of the present invention with reference to accompanying drawings. Equivalent components will be referred to with the same marks and their description may be omitted.

First Embodiment

Figure 1:
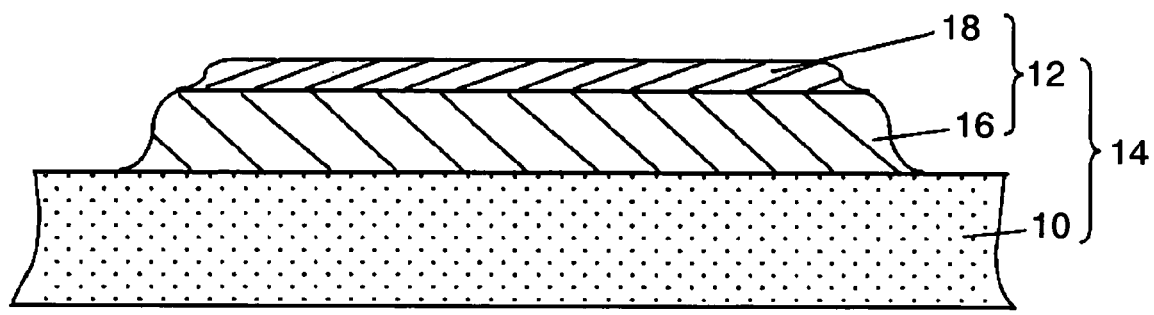
FIG. 1 is a cross sectional view showing a fundamental structure of an interconnection substrate according to a first embodiment of the present invention.
Figure 2:
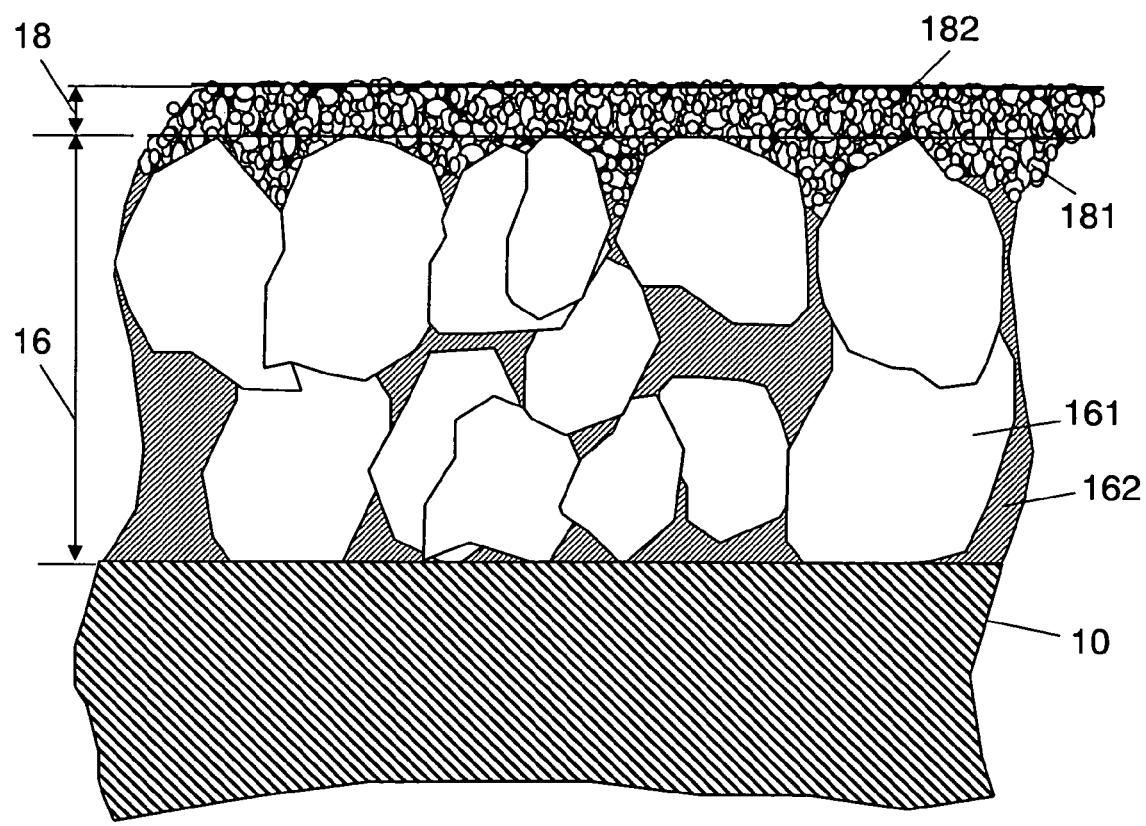
FIG. 2 is an enlarged schematic cross sectional view showing structure of a main part of an interconnection part shown in FIG. 1.

FIG. 1 is a cross sectional view showing a main structure of an interconnection substrate according to a first embodiment of the present invention. FIG. 2 is an enlarged schematic cross sectional view showing structure of a main part of an interconnection part shown in FIG. 1.

Interconnection substrate 14 is provided with substrate 10 made of insulating material, and interconnection layer 12 consisting of first conductor layer 16 and second conductor layer 18, which are stacked in that order on substrate 10 and which each contain conductive particles and a binder. As shown in FIG. 1, interconnection layer 12 has some region where first and second conductor layers 16 and 18 are stacked vertically, and another non-illustrated region where first conductor layer 16 is solely formed.

As shown in FIG. 2, a major difference between first conductor layer 16 and second conductor layer 18 is that they respectively have first conductive particles 161 and second conductive particles 181, which are different in average particle size from each other. To be more specific, second conductor layer 18 having second conductive particles 181 with a smaller average particle size is stacked on first conductor layer 16 having first conductive particles 161 with a larger average particle size. Furthermore, first conductor layer 16 and second conductor layer 18 are made of different conductive pastes from each other, and the conductive pastes contain binders different in type and content. Specifically, second binder 182 contained in second conductor layer 18 is smaller in quantity than first binder 162 contained in first conductor layer 16. A reason for this is that second conductive particles 181 composing second conductor layer 18 are small enough in size to sinter at 200° C. or below, or even 150° C. or below, thereby making it unnecessary to use second binder 182 for a purpose of bonding second conductive particles 181 to each other.

Substrate 10 may be any kind that is used for normal circuit substrates, such as a heat-resistant substrate made of glass fiber-containing epoxy resin or a ceramic plate, or a film sheet made from polyethyleneterephthalate (PET), acrylonitrilebutadienestyrene (ABS), polycarbonate or polyimide. Of these materials, the aforementioned film sheet is preferable to achieve low-profile interconnection substrates because it is a product for general-purpose applications and is therefore inexpensive, and also because it allows the substrate to be thinned to 10 to 400 μm.

Second conducive particles 181 may be made of metal with excellent conductivity such as gold, silver, copper, nickel, palladium or a silver-palladium alloy. Such metal is powdered to have an average particle size of at most 10 nm, coated with a dispersant such as amine, alcohol or thiol, and then dispersed and mixed with an organic binder that is second binder 182, thereby forming microfine particle paste. Using the microfine particle paste to form second conductor layer 18 can decrease an apparent specific resistance of interconnection layer 12 to at most $1 \times 10^{-5}$ Ω·cm.

In FIG. 2, sintering is performed by using second conductive particles 181 and an organic binder, which is second binder 182, so that the organic binder is left in second conductor layer 18 after the sintering. Alternatively, it is possible not to use the organic binder and instead to coat second conductive particles 181 with a dispersant and to use as a coating solution dispersed in a solution. In that case, second conductive particles 182 can have a further improved sintering degree, thereby reducing resistance. For example, in a case where second conductive particles 181 are made of silver having a particle size of 5 nm, when heated to a temperature of around 200° C., the particles come into contact with each other and fuse or sinter, thereby forming a thin film. This silver thin film thus formed can have a specific resistance of about 3 μΩ·cm.

On the other hand, first conductive particles 161 can also be made of metal with excellent conductivity such as gold, silver, copper, nickel, palladium or a silver-palladium alloy. Following is a description of a case of using silver particles having an average particle size of not less than 1 μm nor more than 30 μm. The silver particles are dispersed and mixed with first binder 162 to prepare conductive paste from which a conductor paste layer is formed by a printing process such as screen printing. Such a method enables first conductor layer 16 with a specific resistance of $1 \times 10^{-3}$ to $1 \times 10^{-4}$ Ω·cm to be formed easily and at low cost. In the conductive paste composed of first conductive particles 161 having such a particle size, first conductive particles 161 are bonded to each other via first binder 162 without touching each other. Some of first conductive particles 161 come into direct contact with each other, but most of them do not and are linked via first binder 162. In this region a tunnel current flows, thereby making it impossible to reduce interconnection resistance by this conductive paste.

By the way, an average particle size of second conductive particles 181 is preferably small enough to allow the particles to burrow their way into gaps which are to be caused when first conductive particles 161 are packed closest. Specifically, a preferable average particle size of second conductive particles 181 is not more than 100 nm. With an average particle size of at most 100 nm, second conductive particles 181 come into contact with each other and fuse or sinter when heated to around 200° C. As a result, a specific resistance can be decreased to a level close to that of bulk material. A sintering temperature can be decreased with decreasing average particle size. As a result, the second conductor layer can be formed on an inexpensive film substrate with a low heat resistant temperature such as polyethyleneterephthalate (PET) or polyimide (PI). An average particle size for metal microfine particles has a limit value of 1 nm, and a size of 100 nm or larger is not preferable because it increases a heating temperature for sintering. Consequently, the average particle size is preferably in the range of 1 to 100 nm. Even if the average particle size of the second conductive particles is within the aforementioned range, it is not preferable for the second conductive particles to have a large variety of particle sizes because it increases the heating temperature for the sintering. The variety is preferably minimized and is required to be in the range of plus/minus several nanometers.

First binder 162 is preferably made of thermosetting or ultraviolet setting resin such as polyester resin, epoxy resin, acrylic resin, polyimide resin or polyurethane resin for an advantage of increasing adhesion strength with substrate 10, and also strength of interconnection layer 12 itself.

Thus, stacking second conductor layer 18 onto first conductor layer 16 can reduce an interconnection resistance of interconnection layer 12 as a whole due to an effect of second conductor layer 18 with small specific resistance.

At an interface between first conductor layer 16 and second conductor layer 18, second conductive particles 181 burrow their way into gaps between first conductive particles 161. When second conductor layer 18 is not stacked, the gaps between first conductive particles 161 on a surface of first conductor layer 16 are filled with first binder 162. In contrast, when second conductor layer 18 is formed, second conductive particles 181 of second conductor layer 18 burrow their way into the gaps between first conductive particles 161. This allows first conductive particles 161 to come into contact with each other via second conductive particles 181, thereby improving electric conduction. As a result, the interconnection resistance can be reduced as a whole.

The present invention is not limited to the aforementioned structure where second conductor layer 18 is stacked onto first conductor layer 16. It is also possible to stack two or more second conductor layers 18 onto first conductor layer 16, thereby further reducing the interconnection resistance.

In a case where interconnection layer 12 is formed of second conductor layer 18 only, without stacking first conductor layer 16, a continuous thin film can be formed by using substrate 10 with a smooth surface so as to reduce the resistance of interconnection layer 12. However, substrates made of glass fiber-containing epoxy resin or polyimide film sheet resin do not generally have a smooth surface. Forming second conductor layer 18 directly onto such a surface causes second conductor layer 18 to have a region where second conductive particles 181 cannot easily come into contact with each other because second conductive particles 181 are much smaller in size than asperities on a surface of substrate 10. In such region, second conductive particles 181 may not fuse, thereby making it harder to reduce the resistance, compared with a case of forming second conductor layer 18 on a smooth surface. Such a phenomenon could be prevented by thickening second conductor layer 18; however, second conductive particles 181 are comparatively expensive and it is difficult for them to have sufficient thickness when the second conductor layer is formed by printing, writing or ink jetting. Therefore, it is not appropriate to form interconnection layer 12 exclusively of second conductor layer 18.

Figure 3A:
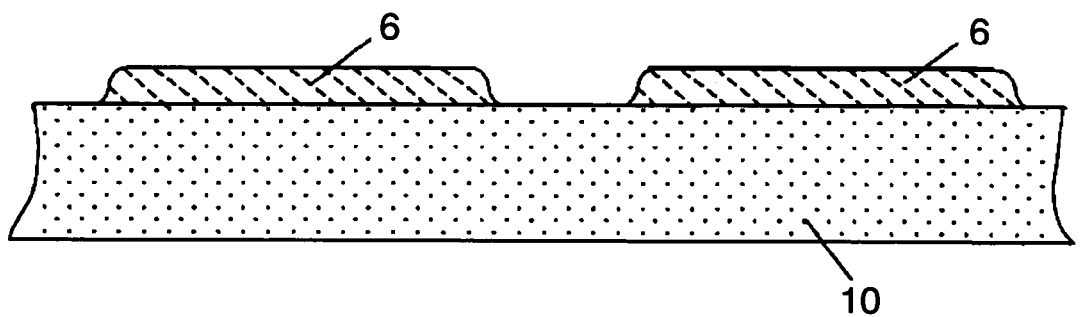
FIG. 3A is a cross sectional view showing a main process in a method for fabricating the interconnection substrate according to the first embodiment of the present invention, and showing a condition where a first conductive paste layer has been formed by a printing process.
Figure 3B:
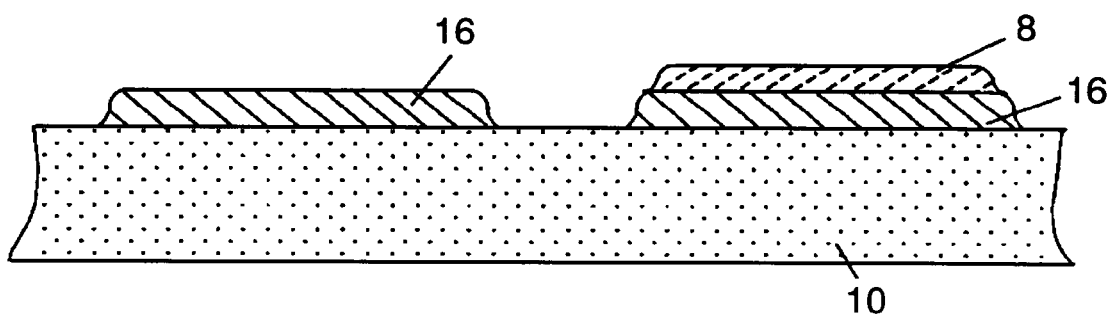
FIG. 3B is a cross sectional view showing a main process in the method for fabricating the interconnection substrate according to the first embodiment of the present invention, and showing a condition where a second conductive paste layer has been formed in a prescribed region on a surface of the first conductive paste layer.
Figure 3C:
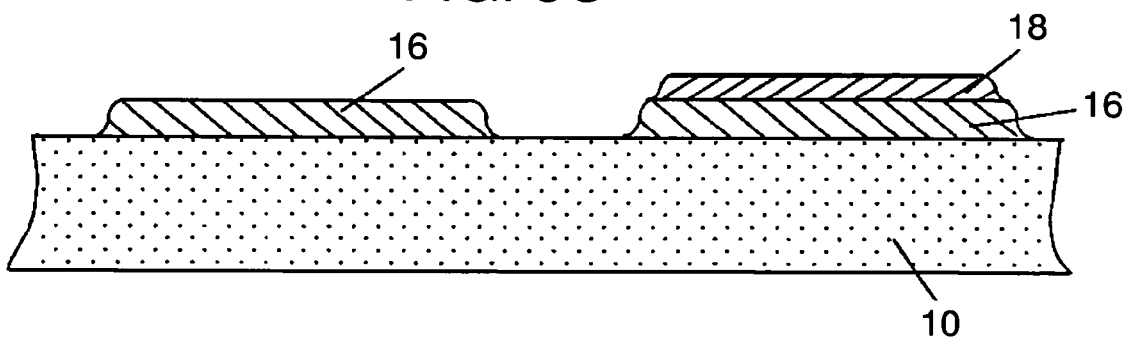
FIG. 3C is a cross sectional view showing a main process in the method for fabricating the interconnection substrate according to the first embodiment of the present invention, and showing a condition where the second conductive paste layer has been heated to form a second conductor layer.

A method for fabricating an interconnection substrate according to the present embodiment will be described as follows with reference to FIGS. 3A to 3C. FIGS. 3A to 3C are cross sectional views of main processes in a method for fabricating an interconnection substrate according to the present embodiment.

First of all, as shown in FIG. 3A, conductive paste (average particle size: 1 to 30 μm) containing first conductive particles 161 described with FIG. 1 is printed on substrate 10 to form first conductive paste layer 6 by a normal printing process, such as screen printing or stencil printing. This is referred to as a first conductive paste layer formation process.

Then, first conductive paste layer 6 is dried or heated to harden, thereby forming first conductor layer 16. This is referred to as a first conductor layer formation process.

Next, as shown in FIG. 3B, second conductive paste layer 8 is formed on a surface of first conductor layer 16. This is done by using a normal printing process, such as screen printing or stencil printing, or ink jetting, and using microfine particle paste (average particle size: 1 to 100 nm) containing second conductive particles 181. This is referred to as a second conductive paste layer formation process. Since the microfine particle paste has a small average particle size and the film to be formed from the paste can be thin, second conductive paste layer 8 can be formed by ink jetting.

Next, as shown in FIG. 3C, second conductive paste layer 8 is heated to cause second conductive particles 181 to come into direct contact with each other to fuse or sinter, thereby forming second conductor layer 18. At this moment, at an interface between first conductor layer 16 and second conductor layer 18, first binder 162 contained in first conductor layer 16 is also softened, thereby allowing second conductive particles 181 of second conductive paste layer 8 to easily burrow their way into gaps between first conductive particles 161. Second conductive particles 181 thus burrowed into the gaps not only come into contact with each other and fuse or sinter, but also come into direct contact with first conductive particles 161. This is referred to as a second conductor layer formation process.

Later, substrate 10 is cooled to obtain interconnection substrate 14. In the present embodiment, second conductor layer 18 is formed exclusively in a region of interconnection layer 12 that is required to reduce resistance, whereas a remaining region of interconnection layer 12 has only first conductor layer 16 therein.

Thus, an intended region is exclusively made to have layers stacked thereon so as to reduce resistance in the region, and a remaining region is made to have one layer thereon. This results in an interconnection substrate which has a low resistance exclusively in the intended region and can be fabricated at low cost.

Besides the aforementioned fabrication method, the following fabrication method can be also used. After the first conductive paste layer formation process is complete, second conductive paste layer 8 is stacked on first conductive paste layer 6 by ink jetting or writing, without applying a hardening treatment with heat. After this, first conductive paste layer 6 and second conductive paste layer 8 are heated concurrently. This heating provides first conductive paste layer 6 with a hardening treatment to form first conductor layer 16. On the other hand, when second conductive paste layer 8 is thus heated, second conductive particles 181 come into contact with each other to fuse or sinter. At this moment, first binder 162 contained in first conductive paste layer 6 is also softened, thereby allowing second conductive particles 181 of second conductive paste layer 8 to easily burrow their way into gaps between first conductive particles 161. Second conductive particles 181 thus burrowed into the gaps not only come into contact with each other and fuse or sinter, but also come into direct contact with first conductive particles 161. This results in further reduction in interconnection resistance.

Interconnection substrate 14 of the present embodiment will be described in more detail as follows, based on a specific example.

Substrate 10 is a resin substrate made of a 50 to 200 μm-thick polyethyleneterephthalate sheet (amorphous polyethyleneterephthalate "PET-G" manufactured by Toray Plastic Films Co. Ltd.). The first conductive paste is prepared with 75 parts of conductive particles by weight (Ag particles with an average particle size of 1 μm) and 25 parts of thermosetting binder by weight (a mixture of bisphenol-A epoxy resin and bisphenol-F epoxy resin). The microfine particle paste is prepared by using Ag particles with an average particle size of 10 nm (Ag nano paste "NPS-J" manufactured by Harima Chemicals. Inc.).

To prepare interconnection substrate 14, first of all, first conductive paste layer 6 (line width: 50 μm×length 5 mm×film thickness 20 μm) is printed by screen printing on a plurality of prescribed positions on substrate 10 by using the first conductive paste. After the printing, this structure is put in a hot air circulating furnace set at 110° C., and heated for 10 minutes so as to harden first conductive paste layer 6, thereby forming first conductor layer 16.

Next, second conductive paste layer 8 is formed on a prescribed region of first conductor layer 16 using the microfine particle paste by a dispensing method. Then, this structure is put in a hot air circulating furnace set at 140° C. and heated for two hours so as to sinter second conductive paste layer 8, thereby forming second conductor layer 18 (line width: 40 μm×length 5 mm×film thickness 4 μm).

This results in interconnection substrate 14 where first conductor layer 16 made of the first conductive paste and second conductor layer 18 made of the microfine particle paste are stacked in that order. Interconnection substrate 14 thus obtained has been examined for bond strength and interconnection resistance. The bond strength has been checked by applying a general taping test in the region where first conductor layer 16 and second conductor layer 18 are stacked. Results have confirmed that the region of interconnection layer 12 that has first conductor layer 16 and second conductor layer 18 is firmly bonded to substrate 10 without causing any exfoliation at all. In addition, the region of the interconnection layer 12 that has first conductor layer 16 and second conductor layer 18 has been subjected to a four probe method to find that the interconnection resistance is 2.27Ω.

Furthermore, first conductive paste layer 6 is formed using the first conductive paste, and second conductive paste layer 8 is formed by applying a microfine particle paste onto first conductive paste layer 6 by the same process as described above. The microfine particle paste is an Ag nano paste only different in average particle size from the aforementioned microfine particle paste, and has an average particle size of 100 nm. After formation of second conductive paste layer 8, this structure is put in a hot air circulating furnace set at 140° C. and heated for two hours so as to subject first conductive paste layer 6 and second conductive paste layer 8 to a hardening treatment concurrently.

In interconnection substrate 14 thus prepared, a cross section of an interconnection part where first conductor layer 16 and second conductor layer 18 are stacked has been observed with an electronic microscope. This observation shows that at an interface between first conductor layer 16 and second conductor layer 18, second conductive particles 181, which are the Ag particles of second conductor layer 18, have burrowed their way into the Ag particles of first conductor layer 16, and that second conductive particles 181 are in contact with each other and fuse. In addition, an interconnection resistance has been measured by the four probe method in the same manner as described above to find that its value is 3.55Ω. In this example, second conductive particles 181 of the microfine particle paste have so large a particle size that fusing is not sufficient at 140° C. and the interconnection resistance becomes slightly larger than the aforementioned example.

The microfine particle paste, which is the second conductive paste, can also be applied by ink jetting. In that case, second conductive paste layer 8 of the aforementioned specific example can be formed under the conditions of dot pitch: 25 μm×25 μm and droplet amount: 3.0 pl.

Second Embodiment

Figure 4:
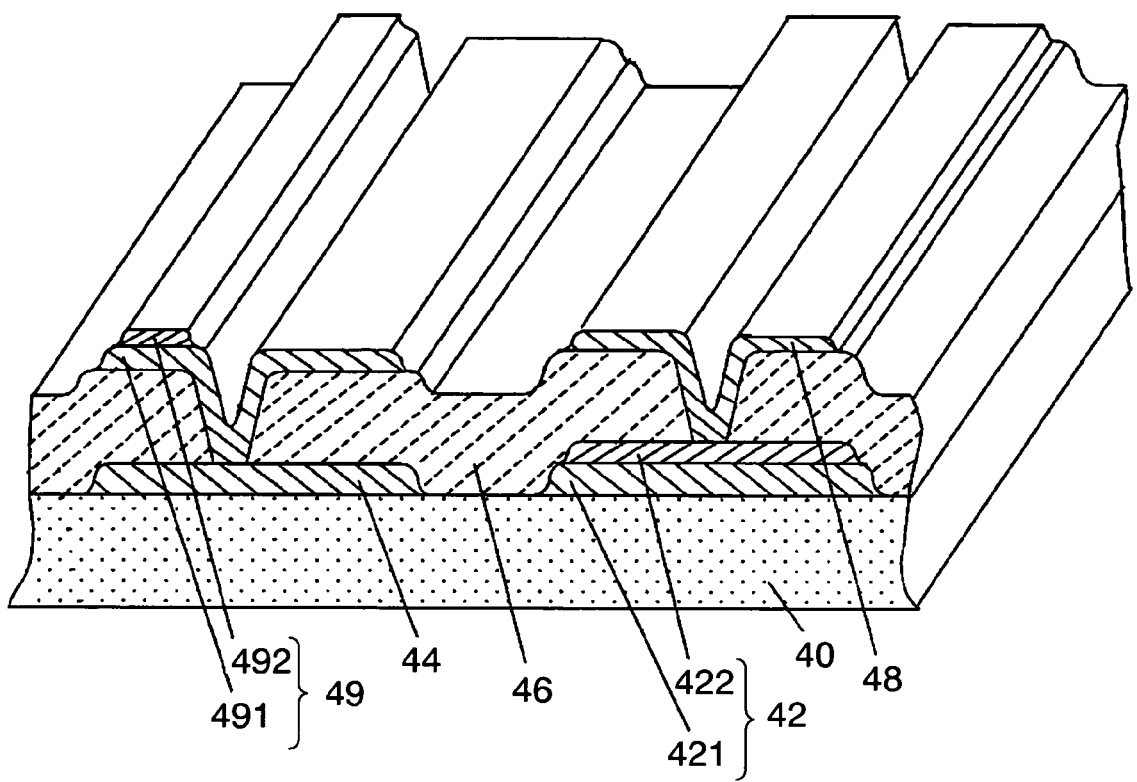
FIG. 4 is a cross sectional perspective view of a multilayer interconnection substrate according to a second embodiment of the present invention.

FIG. 4 is a cross sectional view of a multi-layer interconnection substrate according to a second embodiment of the present invention. A method for fabricating an interconnection substrate of the present invention can be applied to a case where a multi-layer interconnection substrate is formed by stacking an interconnection layer and an insulating film onto a substrate by a build-up process.

As shown in FIG. 4, substrate 40 has first-layer interconnections 42 and 44 formed thereon. First-layer interconnection 42 is formed of first conductor layer 421 made of first conductive paste, and second conductor layer 422 made of microfine particle paste, which is second conductive paste. First-layer interconnection 44 is exclusively formed of first conductor layer 421 made of the first conductive paste.

First-layer interconnections 42 and 44 are coated with insulating film 46 except for some regions thereof. First-layer interconnections 42 and 44 are also connected respectively with second-layer interconnections 48 and 49 as shown in FIG. 4. Second-layer interconnection 48 is formed of first conductor layer 491 made of the first conductive paste. On the other hand, second-layer interconnection 49 is formed of first conductor layer 491 made of the first conductive paste, and second conductor layer 492, which is made of the microfine particle paste and which is formed on part of first conductor layer 491.

By forming second conductor layers 422, 492 by applying microfine paste exclusively onto a region required to have low resistance, it becomes possible to fabricate a multi-layer interconnection substrate required to have low resistance exclusively in an intended region by a simple and inexpensive process. For example, making second-layer interconnection 49 a signal line of an image display device can avoid a delay in image signal transmission since the signal line has low resistance, thereby preventing image quality deterioration.

In a case where some region with reduced resistance is provided by stacking the interconnection layer by conventional electroplating, a direct contact between the interconnection layer and an electroplated terminal may cause disconnection. To avoid this, it is necessary to provide a process for drawing an interconnection out from a region required to reduce resistance before electroplating, and then removing this drawn out interconnection after the electroplating. In contrast, according to the present invention, since the intended region can exclusively have low resistance, the process of drawing out and then removing the interconnection is made unnecessary, thereby simplifying this fabrication process.

In the multi-layer interconnection substrate according to the present embodiment, first-layer interconnections 42, 44 and second-layer interconnections 48, 49 are connected with each other via prolonged conduction connection parts; however, the conduction connection parts are not limited to this shape. The conduction connection parts can be circular or square via-holes which are generally formed.

Third Embodiment

Figure 5A:
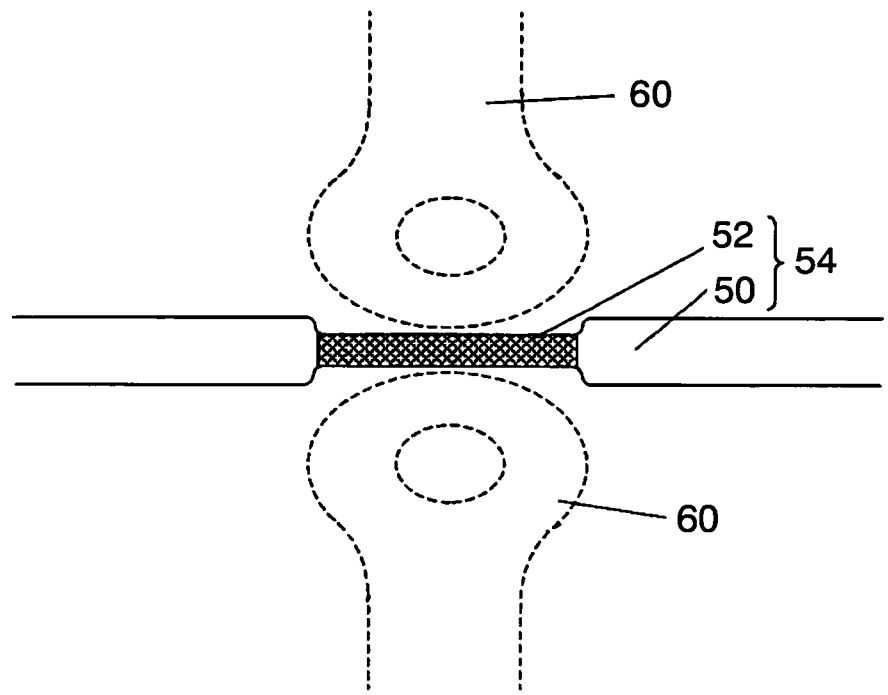
FIG. 5A is a plan view to depict a condition where an interconnection layer has some region with reduced resistance on an interconnection substrate according to a third embodiment of the present invention.
Figure 5B:
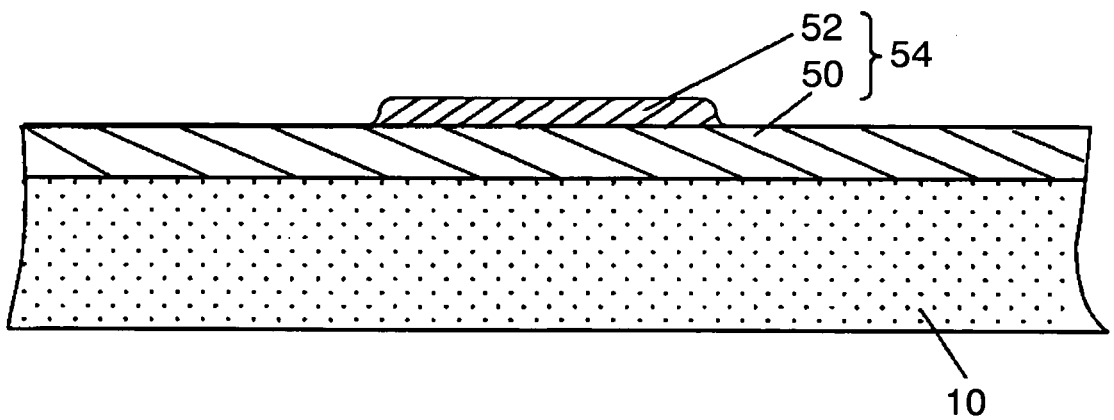
FIG. 5B is a cross sectional view taken along the interconnection layer shown in FIG. 5A.

FIGS. 5A and 5B are views to depict a condition where in an interconnection substrate according to a third embodiment of the present invention, interconnection layer 54 has some region with reduced resistance. FIG. 5A is a plan view of the interconnection substrate, and FIG. 5B is a cross sectional view taken along interconnection layer 54 shown in FIG. 5A.

As shown in FIG. 5A, the interconnection substrate according to the present embodiment is structured to cope with a case where electronic component 60 must be mounted in the vicinity of interconnection layer 54. To be more specific, mounting electronic component 60 in the vicinity of interconnection layer 54 sometimes requires that interconnection layer 54 be reduced in width in some part thereof, instead of having a uniform width. In such a case, interconnection layer 54 formed exclusively of first conductor layer 50 increases resistance, thereby requiring detouring at an interconnection path. However, reducing the width of the interconnection layer 54 in some part thereof and stacking second conductor layer 52 on the part can maintain low resistance. Thus, second conductor layer 52 is formed exclusively in a region of interconnection layer 54 that is required to have low resistance by applying microfine particle paste so as to achieve resistance reduction, and a remaining region of interconnection layer 54 is formed of first conductor layer 50 only.

Structure of the interconnection substrate will be described as follows, based on FIG. 5B. A first conductive paste layer made of first conductive paste is applied onto a surface of substrate 10 by screen printing, stencil printing or the like. Then, a second conductive paste layer made of the microfine particle paste is formed exclusively on a region of the first conductive paste layer that is required to have low resistance by ink jetting, dispensing or the like. Next, these layers are heated to make the first conductive paste layer first conductor layer 50, and the second conductive paste layer second conductor layer 52. Interconnection layer 54 is composed of a region having first conductor layer 50 only, and a remaining region where first conductor layer 50 and second conductor layer 52 are stacked.

The aforementioned structure allows the region required to have low resistance to exclusively have low resistance, thereby achieving expected interconnection substrate properties and cost reduction at the same time.

Figure 6:
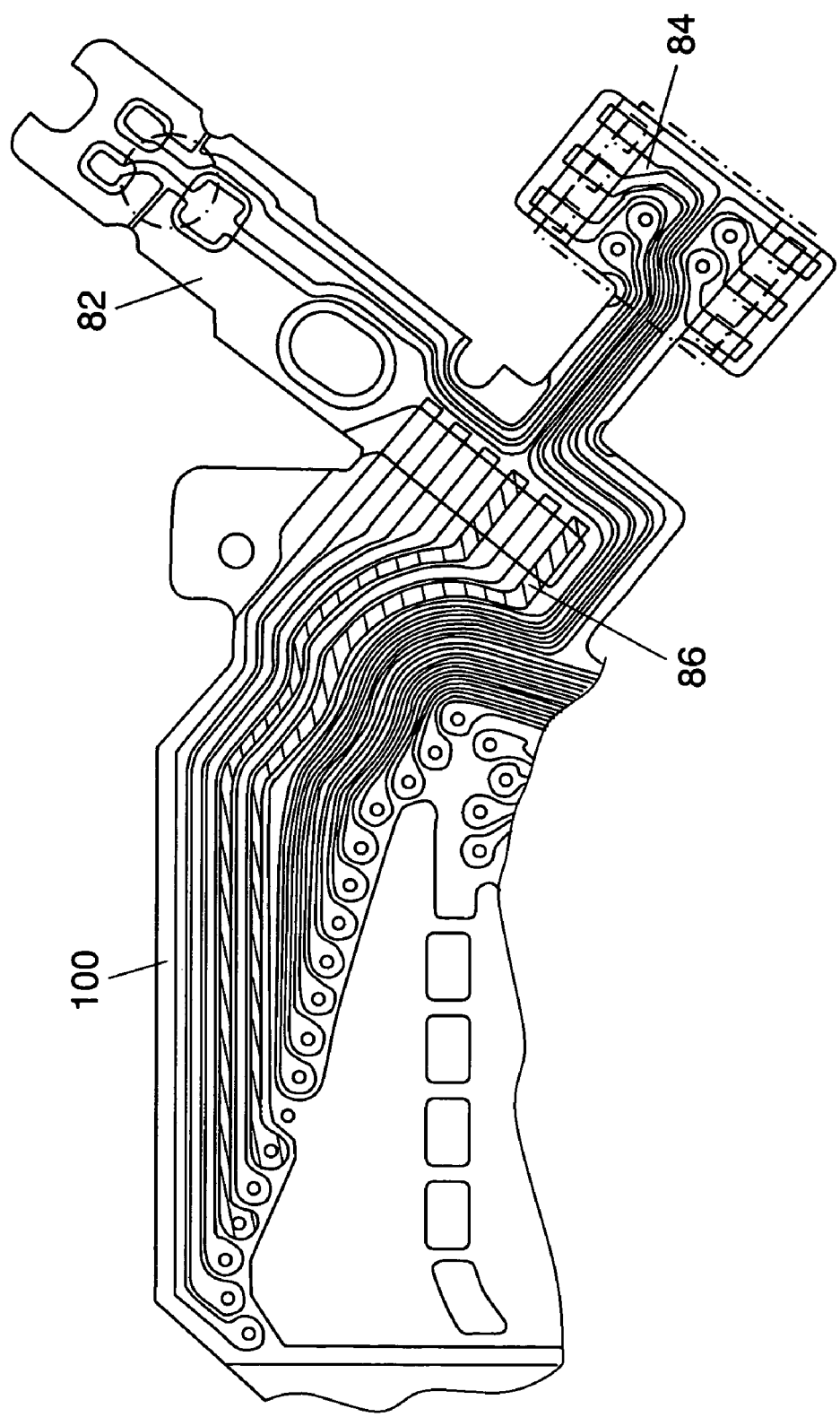
FIG. 6 is a plan view of main part of an interconnection substrate having flexibility for use in an optical pickup as another specific example of the interconnection substrate according to the third embodiment of the present invention.

Another specific application will be described in detail as follows with reference to FIG. 6. FIG. 6 is a plan view showing a main part of an interconnection substrate having flexibility for use in an optical pickup. The interconnection substrate includes CD-LDV part (not illustrated), front monitor part 84, DVD-LDV part (not illustrated), a temperature sensor part (not illustrated), actuator part 82 and an interconnection layer for connecting these components. This interconnection substrate has a complicated shape so that it can be housed at high density in a folded condition in a casing. In the interconnection substrate, after a first conductor layer is formed from conductive paste by screen printing, a second conductor layer is formed by applying microfine particle paste exclusively onto a region that is required to have low resistance by a dispensing method.

The interconnection layer consisting exclusively of the first conductor layer can operate sufficiently as a whole; however, e.g. in an interconnection of actuator part 82, ACT signal line 86 for controlling behavior of the actuator is required to have low resistance. In the interconnection of actuator part 82, interconnection 100 can operate sufficiently with the first conductor layer only, unlike ACT signal line 86. Therefore, it is much more efficient for cost reduction to make ACT signal line 86 have low resistance exclusively than to fabricate the interconnection substrate by using material and a method capable of achieving resistance reduction.

On the other hand, if ACT signal line 86 is formed to exclusively have the first conductor layer and to have the same width as the other interconnection layer, then interconnection resistance is about 12 to 13Ω. On the other hand, the interconnection resistance to be required is 0.6 to 0.7Ω. Therefore, achieving an interconnection resistance equal to or lower than a target value only by the first conductor layer requires a large increase in a width and thickness of the interconnection. This results in a size increase in the interconnection substrate, and also in a thickness increase in some local region of the interconnection substrate, thereby damaging flexibility and making it difficult to be housed in the casing.

In contrast, forming the second conductor layer on the first conductor layer in such a manner as to have a thickness of about 4 μm by applying the microfine particle paste can make the interconnection resistance not more than 0.7Ω. In ACT signal line 86 having the second conductor layer, a film thickness increases about 15% compared with interconnection 100, but this causes no problem with regard to formation of the surface protective film or flexibility. Although in this flexible interconnection substrate it is necessary to make several electric power lines that have low resistance, its description will be omitted because they can be formed in the same manner as above.

The interconnection substrate having flexibility for use in an optical pickup has been described hereinbefore; however, the present invention can also be applied to interconnection substrates used for other various kinds of circuits. For example, to deal with high-frequency circuits in communication devices and portable terminals, a second conductor layer made of microfine particle paste with low specific resistance can be formed as a surface layer. This can prevent property deterioration by skin effect when flow of a high frequency current is concentrated on the surface layer.

In a substrate having semiconductor memory thereon, an interconnection between an electric power-supply terminal of the semiconductor memory and an electrode terminal of the substrate can be made to have low resistance so as to reduce a voltage drop, thereby improving data retention properties.

As described hereinbefore, the present invention can provide an interconnection substrate and a fabrication method thereof which can achieve a reduction in interconnection resistance without increasing an environmental load since a process of disposing electroplating wastewater and the like is unnecessary.

In the present invention, it is possible that the second conductive paste is made of the second conductive particles, a dispersant and an organic binder, and that the binder in the first conductive paste contains, at least in part, the organic binder. This structure enables the organic binder contained in the first conductive paste to also affect contact and fusion of the second conductive particles of the second conductive paste when the second conductive paste layer is heated. With this structure, the binder on the surface of the first conductor layer effectively acts on sintering of the second conductive particles of the second conductive paste, thereby successfully reducing an amount of organic binder to be used in the second conductive paste. This structure also makes it easier for the second conductive particles to burrow their way into gaps between the first conductive particles when heated, thereby further reducing a resistance value.

What is claimed is:

1. An interconnection substrate comprising:
   a substrate;
   a first conductor layer on said substrate, said first conductor layer containing first conductive particles and a binder; and
   a second conductor layer on said first conductor layer, said second conductor layer containing second conductive particles, wherein an average particle size of said second conductive particles is smaller than an average particle size of said first conductive particles.

2. The interconnection substrate according to claim 1, wherein
for a portion where said first conductor layer and said second conductor layer are co-extensive, said first conductor layer and said second conductor layer define an interconnection layer region provided exclusively in a prescribed region part, and
in a remaining region part, for a portion where said first conductor layer and said second conductor layer are not co-extensive, provided exclusively is said first conductor layer.

3. The interconnection substrate according to claim 2, wherein
the average particle size of said second conductive particles is in a range of from 1 nm to 100 nm.

4. The interconnection substrate according to claim 2, wherein
said binder comprises one of thermosetting resin and ultraviolet setting resin.

5. The interconnection substrate according to claim 2, further comprising:
an insulating film covering at least a portion of said interconnection layer region.

6. The interconnection substrate according to claim 2, wherein
said first conductor layer includes a narrowed portion, with said interconnection layer region corresponding to said narrowed portion.

7. The interconnection substrate according to claim 1, wherein
said second conductive particles are in contact with one another and fused to one another.

8. The interconnection substrate according to claim 7, wherein
said first conductor layer also contains some of said second conductive particles in contact with some of said first conductive particles.

9. The interconnection substrate according to claim 1, wherein
said second conductor layer also contains a binder, with an amount of binder contained in said second conductor layer being less than an amount of binder contained in said first conductor layer.

10. The interconnection substrate according to claim 9, wherein
said second conductive particles are in contact with one another and fused to one another.

11. The interconnection substrate according to claim 1, wherein
said first conductive particles comprise metallic conductive particles, and
said second conductive particles comprise metallic conductive particles.

12. A method for fabricating an interconnection substrate, comprising:
applying a first conductive paste layer onto a substrate, said first conductive paste layer containing first conductive particles and a binder;
hardening said binder so as to convert said first conductive paste layer into a first conductor layer having said first conductive particles;
forming a second conductive paste layer on a prescribed region of said first conductor layer, said second conductive paste layer containing second conductive particles having an average particle size smaller than an average particle size of said first conductive particles; and
heating said second conductive paste layer so as to convert said second conductive paste layer into a second conductor layer, on said first conductor layer, having said second conductive particles.

13. The method according to claim 12, wherein
heating said second conductive paste layer results in said second conductive particles coming into contact with one another and fusing to one another.

14. The method according to claim 13, wherein
hardening said binder comprises heating said first conductive paste layer.

15. The method according to claim 14, wherein
said second conductive paste layer also contains a dispersant and an organic binder, and said binder contained in said first conductive paste layer includes, at least in part, a binder having the same composition as said organic binder, and
heating said second conductive paste layer causes said binder having the same composition as said organic binder to affect contact and fusion of said second conductive particles.

16. The method according to claim 13, wherein
applying a first conductive paste layer onto a substrate, hardening said binder, applying a second conductive paste layer onto said first conductor layer, and heating said second conductive paste layer comprises
(i) applying said first conductive paste layer onto said substrate,
(ii) applying said second conductive paste layer onto a prescribed region of said first conductive paste layer, and then
(iii) heating said first conductive paste layer and said second conductive paste layer concurrently.

17. The method according to claim 16, wherein
said second conductive paste layer also contains a dispersant and an organic binder, and said binder contained in said first conductive paste layer includes, at least in part, a binder having the same composition as said organic binder, and
heating said first conductive paste layer and said second conductive paste layer concurrently causes said binder having the same composition as said organic binder to affect contact and fusion of said second conductive particles.

18. The method according to claim 13, wherein
said average particle size of said second conductive particles is in a range of from 1 nm to 100 nm.

19. The method according to claim 13, wherein
heating said second conductive paste layer also results in some of said second conductive particles burrowing into said first conductor layer and coming into contact with some of said first conductive particles.

20. The method according to claim 12, wherein
said first conductive particles comprise metallic conductive particles, and
said second conductive particles comprise metallic conductive particles.

* * * * *